United States Patent
Hong et al.

(10) Patent No.: US 9,825,251 B2
(45) Date of Patent: Nov. 21, 2017

(54) DISPLAY APPARATUS COMPRISING A SEAL PORTION HAVING TWO DIFFERENT THICKNESSES

(71) Applicant: Samsung Display Co., Ltd., Yongin, Gyeonggi-Do (KR)

(72) Inventors: Sangmin Hong, Yongin (KR); Jungi Youn, Yongin (KR); Goeun Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 16 days.

(21) Appl. No.: 14/792,171

(22) Filed: Jul. 6, 2015

(65) Prior Publication Data

US 2016/0226016 A1    Aug. 4, 2016

(30) Foreign Application Priority Data

Feb. 3, 2015  (KR) .................. 10-2015-0016737

(51) Int. Cl.
  *H01L 51/52* (2006.01)
  *H01L 33/52* (2010.01)
  *H01L 27/32* (2006.01)

(52) U.S. Cl.
  CPC .......... *H01L 51/5246* (2013.01); *H01L 33/52* (2013.01); *H01L 27/3244* (2013.01)

(58) Field of Classification Search
  CPC ........................... H01L 51/5246; H01L 33/52
  See application file for complete search history.

(56) References Cited

U.S. PATENT DOCUMENTS

| 2007/0194304 A1 | 8/2007 | Zu et al. |
| 2010/0060603 A1* | 3/2010 | Kurashima ............. G06F 3/045 345/173 |
| 2012/0012890 A1 | 1/2012 | Lee et al. |
| 2015/0296573 A1* | 10/2015 | Hsiao .................. H01L 51/5246 359/850 |

FOREIGN PATENT DOCUMENTS

| JP | 09-331488 A | 12/1997 |
| JP | 2012-048274 A | 3/2012 |
| KR | 10-0659120 B1 | 12/2006 |
| KR | 10-2007-0083154 A | 8/2007 |
| KR | 10-2008-0009983 A | 1/2008 |
| KR | 10-2012-0007355 A | 1/2012 |

* cited by examiner

*Primary Examiner* — Marcos D Pizarro
*Assistant Examiner* — Christopher M Roland
(74) *Attorney, Agent, or Firm* — Knobbe, Martens, Olson & Bear, LLP

(57) ABSTRACT

A display apparatus comprises a substrate, an encapsulation panel opposing the substrate, a display unit disposed between the substrate and the encapsulation panel and a seal portion bonding the substrate and the encapsulation panel and surrounding the display unit. The seal portion comprises a first surface facing the substrate and a second surface facing the encapsulation panel. The seal portion has a first thickness that is a distance between the first surface and the second surface measured at a first point and a second thickness that is a distance between the first surface and the second surface measured at a second point. A first virtual line passing a center point of the display area and the first point is substantially perpendicular to a second virtual line passing the center point and the second point. The first thickness is substantially different from the second thickness.

7 Claims, 5 Drawing Sheets

DISPLAY APPARATUS COMPRISING A SEAL PORTION HAVING TWO DIFFERENT THICKNESSES

RELATED APPLICATION

This application claims the benefit of Korean Patent Application No. 10-2015-0016737, filed on Feb. 3, 2015, in the Korean Intellectual Property Office, the disclosure of which is incorporated herein in its entirety by reference.

BACKGROUND

1. Field

One or more embodiments relate to a display apparatus and a method of manufacturing the display apparatus.

2. Description of the Related Art

Recently, display apparatuses have been used in various fields. In particular, as the display apparatuses become thinner and lighter, ranges of using the display apparatus have expanded. Such a display apparatus may be manufactured by using various methods, for example, a display unit for displaying images may be disposed between a substrate and an encapsulation substrate. Here, the substrate and the encapsulation substrate are bonded to each other by a sealing portion so as to prevent external air, moisture, and other impurities from infiltrating into the display unit. However, when bonding the substrate and the encapsulation substrate together, the encapsulation substrate may be curved. Accordingly, a difference in paths of light incident from the outside occurs, and Newton's ring effect, that is a series of concentric rings caused by optical interference, may occur.

SUMMARY

One or more embodiments include a display apparatus and a method of manufacturing the display apparatus, capable of preventing visual recognition of Newton's ring.

One aspect provides a display apparatus, which may comprise: a substrate comprising a major surface; an encapsulation panel opposing the substrate; a display unit disposed between the substrate and the encapsulation panel and comprising a display area for displaying images; and a seal portion disposed between the substrate and the encapsulation panel and surrounding the display area when viewed in a direction perpendicular to the major surface, the seal portion bonding the substrate and the encapsulation panel, wherein the seal portion comprises a first surface facing the substrate and a second surface facing the encapsulation panel, wherein the seal portion has a first thickness that is a distance between the first surface and the second surface measured at a first point and a second thickness that is a distance between the first surface and the second surface measured at a second point, wherein, when viewed in the direction, a first virtual line passing a center point of the display area and the first point is substantially perpendicular to a second virtual line passing the center point and the second point, wherein the first thickness is substantially different from the second thickness.

In the foregoing apparatus, the first thickness may be about 60% to about 90% of the second thickness. The seal portion may comprise a first straight portion passing the first point and being parallel to the second virtual line, a second straight portion passing the second point and being parallel to the first virtual line, and a corner portion connecting the first straight portion and the second straight portion. The corner portion may have a curved shape, wherein a distance between the corner portion and the first point is greater than that between the corner portion and the second point. The first straight portion may have the first thickness, the second straight portion has the second thickness, and the corner portion has a thickness gradually changing from the first thickness to the second thickness. The first straight portion may have a thickness gradually changing from the second thickness to the first thickness.

Still in the foregoing apparatus, the display unit may comprise a pad portion electrically connected to the display area for applying electric signals to the display area, and the pad portion is disposed adjacent to the second point and is not surrounded by the seal portion when viewed in the direction. The seal portion may form a closed loop, and the seal portion has a thickness gradually changing from the second thickness to the first thickness between the second point and the first point. The display unit may comprise an array of pixels, each of which comprises an organic light-emitting diode (OLED), wherein the OLED comprises a first electrode, a second electrode, and an intermediate layer disposed between the first electrode and the second electrode and comprising an organic light emission layer. The apparatus may further comprise a thin film transistor (TFT) that is electrically connected to the first electrode and comprises an active layer, a gate electrode, a source electrode, and a drain electrode.

Another aspect provides a method of manufacturing a display apparatus, which may comprise: providing a substrate; forming a display unit over the substrate and comprising a display area for displaying images; placing an encapsulation panel over the substrate, wherein the display unit is disposed between the substrate and the encapsulation panel; and bonding the substrate and the encapsulation substrate by using a seal portion, wherein the seal portion comprises a first surface facing the substrate and a second surface facing the encapsulation panel, wherein the seal portion has a first thickness that is a distance between the first surface and the second surface measured at a first point and a second thickness that is a distance between the first surface and the second surface measured at a second point, wherein, when viewed in the direction, a first virtual line passing a center point of the display area and the first point is substantially perpendicular to a second virtual line passing the center point and the second point, wherein the first thickness is substantially different from the second thickness.

In the foregoing method, bonding may comprise: applying a seal material in a paste state on a surface of the substrate or the encapsulation substrate, baking and drying the seal material, and irradiating a laser beam to the substrate and the encapsulation substrate that are aligned to melt and cure the seal material to form the seal portion. The seal material may be applied to have a first width at the first point and a second width at the second point, wherein the first width is different than the second width. The seal material may be applied by a screen printing method, and the first width is less than the second width.

Still in the foregoing method, the first thickness may be about 60% to about 90% of the second thickness. The seal portion may comprise a first straight portion passing the first point and being parallel to the second virtual line, a second straight portion passing the second point and being parallel to the first virtual line, and a corner portion connecting the first straight portion and the second straight portion. The first straight portion has the first thickness, the second straight portion has the second thickness, and the corner portion may have a thickness gradually changing from the first thickness to the second thickness at the corner portions. The first straight portion may have a thickness gradually changing from the second thickness to the first thickness. The method may further comprise forming a pad portion over the substrate, which is electrically connected to the display area for applying electric signals, wherein the pad portion is disposed adjacent to the second point and is not surrounded by the seal portion when viewed in the direction. Forming of the display unit may comprise forming an array of pixels, each of which comprises an organic light-emitting diode (OLED) on the substrate, wherein the OLED comprises a first electrode, a second electrode, and an intermediate layer disposed between the first electrode and the second electrode and comprising an organic light emission layer.

Additional aspects will be set forth in part in the description which follows and, in part, will be apparent from the description, or may be learned by practice of the presented embodiments.

According to one or more embodiments, a display apparatus including: a substrate; an encapsulation substrate facing the substrate; a display unit disposed between the substrate and the encapsulation substrate and comprising a display area for displaying images; and a sealing portion surrounding the display area and bonding the substrate and the encapsulation substrate to each other, wherein the sealing portion may have a first thickness on a first point and a second thickness on a second point that is different from the first point, wherein the first thickness is different than the second thickness, the first point may be one of two first regions that are obtained when a first virtual line passing through a center point of the display area in a horizontal direction crosses the sealing portion, and the second point may be one of two second regions that are obtained when a second virtual line perpendicularly crossing the first virtual line at the center point crosses the sealing portion.

The first thickness may be 60% to 90% of the second thickness.

The sealing portion may include a pair of first straight portions passing respectively through the two first regions in parallel with the second virtual line, a pair of second straight portions passing respectively through the two second regions in parallel with the first virtual line, and corner portions connecting the pair of first straight portions and the pair of second straight portions to each other.

The corner portions may have curved shapes.

The pair of first straight portions may have the first thickness, the pair of second straight portions may have the second thickness, and a thickness of the sealing portion may continuously change from the first thickness to the second thickness at the corner portions.

The pair of first straight portions may have a thickness that continuously changes from the second thickness to the first thickness from the corner portions toward the first point.

The display unit may include a pad portion via which electric signals are applied to the display area, and the pad portion may be disposed adjacent to one of the two second regions at an outer portion of the display area.

The sealing portion may form a closed loop, and the sealing portion may have a thickness that continuously changes from the second thickness to the first thickness from the second regions toward the first regions.

The display unit may include an organic light-emitting diode (OLED), and the OLED may include a first electrode, a second electrode, and an intermediate layer disposed between the first electrode and the second electrode and including an organic emission layer.

The display apparatus may further include a thin film transistor (TFT) that is electrically connected to the first electrode and include an active layer, a gate electrode, a source electrode, and a drain electrode.

According to one or more embodiments, a method of manufacturing a display apparatus, the method including: preparing a substrate and an encapsulation substrate disposed facing the substrate; forming a display unit disposed between the substrate and the encapsulation substrate and comprising a display area for displaying images; and bonding the substrate and the encapsulation substrate to each other by using a sealing portion, wherein the sealing portion may have a first thickness on a first point and a second thickness on a second point that is different from the first point, wherein the first thickness is different than the second thickness, the first point may be one of two first regions that are obtained when a first virtual line passing through a center point of the display area in a horizontal direction crosses the sealing portion, and the second point may be one of two second regions that are obtained when a second virtual line perpendicularly crossing the first virtual line at the center point crosses the sealing portion.

The bonding of the substrate and the encapsulation substrate to each other may include applying a preliminary sealing portion in a paste state on a surface of the substrate or the encapsulation substrate, baking and drying the preliminary sealing portion, irradiating a laser beam to the substrate and the encapsulation substrate that are aligned to melt and cure the preliminary sealing portion to form the sealing portion.

The preliminary sealing portion may be applied to have a first width at the first point and a second width at the second point, wherein the first width is different than the second width.

The preliminary sealing portion may be applied by a screen printing method, and the first width may be less than the second width.

The first thickness may be 60% to 90% of the second thickness.

The sealing portion may include a pair of first straight portions passing respectively through the two first regions in parallel with the second virtual line, a pair of second straight portions passing respectively through the two second regions in parallel with the first virtual line, and corner portions connecting the pair of first straight portions and the pair of second straight portions to each other, so as to surround the display area.

The pair of first straight portions may have the first thickness, the pair of second straight portions may have the second thickness, and a thickness of the sealing portion may continuously change from the first thickness to the second thickness at the corner portions.

The pair of first straight portions may have a thickness that continuously changes from the second thickness to the first thickness from the corner portions toward the first point.

The method may further include forming a pad portion on the substrate and via which electric signals are applied to the display area, wherein the pad portion is disposed adjacent to one of the two second regions on an outer portion of the display area.

The forming of the display unit may include forming an organic light-emitting diode (OLED) on the substrate, and the OLED may include a first electrode, a second electrode, and an intermediate layer disposed between the first electrode and the second electrode and including an organic emission layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
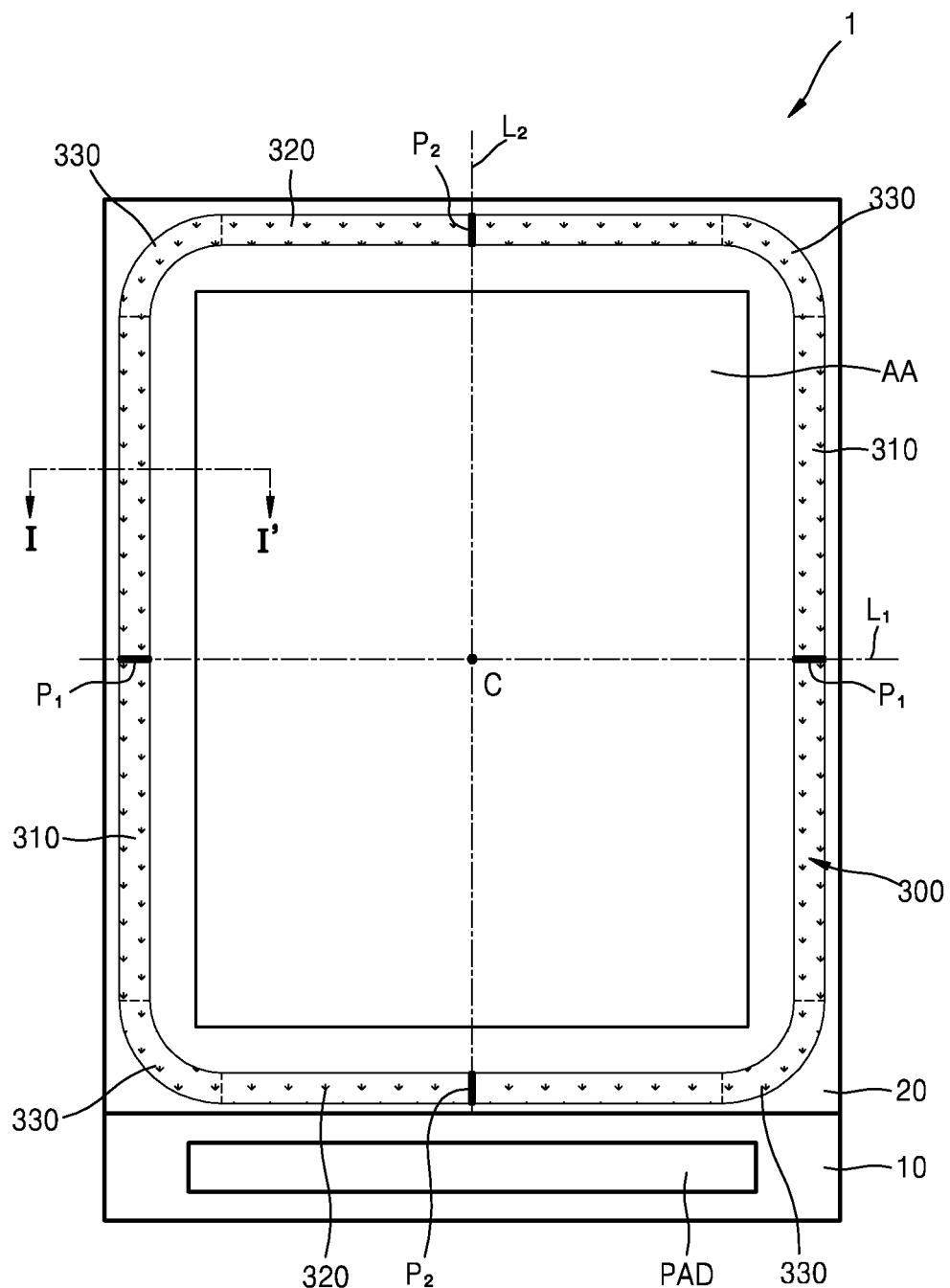
FIG. 1 is a schematic plan view of a display apparatus according to an embodiment of the inventive concept.

As the inventive concept allows for various changes and numerous embodiments, particular embodiments will be illustrated in the drawings and described in detail in the written description. However, this is not intended to limit the present inventive concept to particular modes of practice, and it is to be appreciated that all changes, equivalents, and substitutes that do not depart from the spirit and technical scope of the present inventive concept are encompassed in the present inventive concept. In the description of the present inventive concept, certain detailed explanations of the related art are omitted when it is deemed that they may unnecessarily obscure the essence of the inventive concept.

While such terms as "first," "second," etc., may be used to describe various components, such components must not be limited to the above terms. The above terms are used only to distinguish one component from another.

The terms used in the present specification are merely used to describe particular embodiments, and are not intended to limit the present inventive concept. An expression used in the singular encompasses the expression of the plural, unless it has a clearly different meaning in the context. In the present specification, it is to be understood that the terms such as "including", "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added. As used herein, the term "and/or" includes any and all combinations of one or more of the associated listed items. Expressions such as "at least one of," when preceding a list of elements, modify the entire list of elements and do not modify the individual elements of the list.

Hereinafter, the inventive concept will be described with reference to one or more embodiments shown in accompanying drawings.

Figure 2:
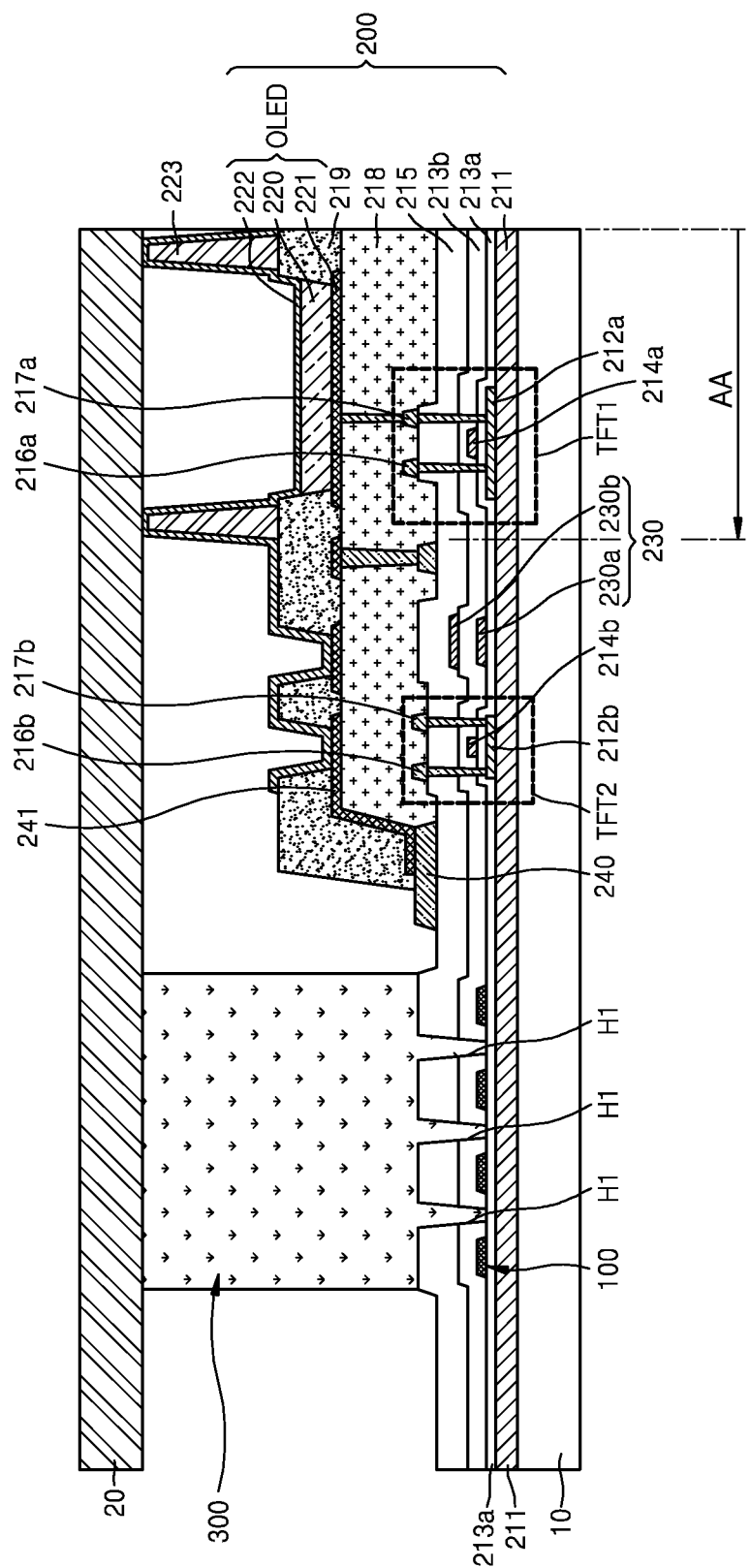
FIG. 2 is a schematic cross-sectional view of the display apparatus taken along a line I-I' of FIG. 1.
Figure 3A:
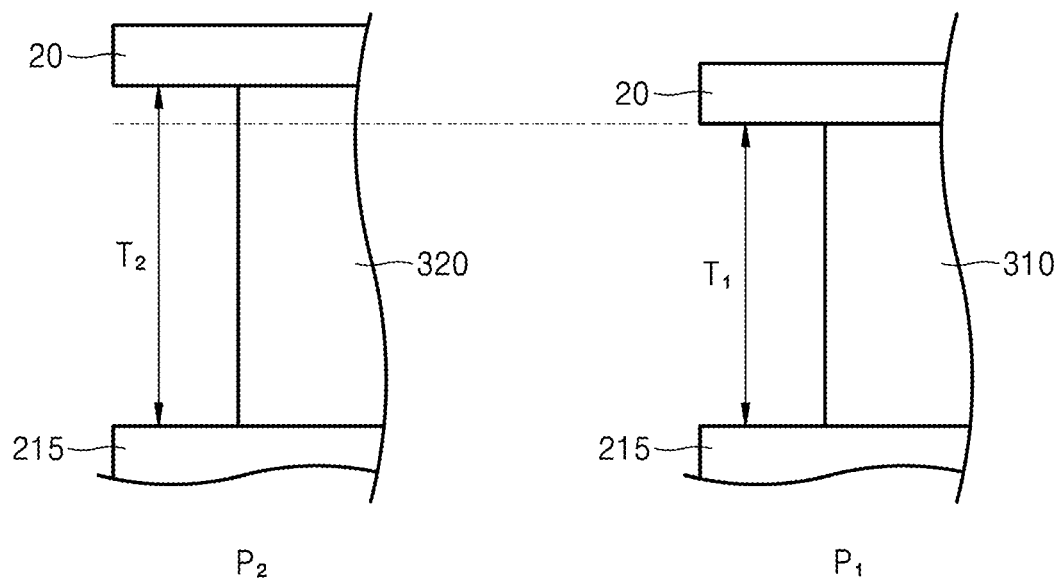
FIG. 3A is a schematic cross-sectional view showing the thickness of the display apparatus of FIG. 1 at a first region and a second region and FIG. 3B is an enlarged view of the corner portion of FIG. 3A.
Figure 3B:
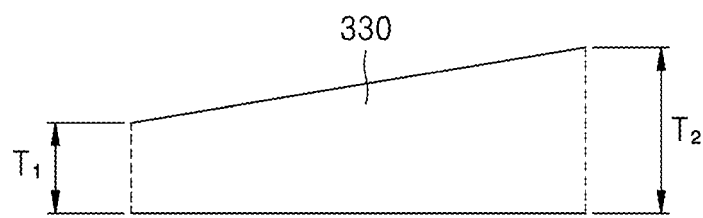

FIG. 1 is a schematic plan view of a display apparatus 1 according to an embodiment of the inventive concept, FIG. 2 is a schematic cross-sectional view of the display apparatus 1, which is taken along a line I-I' of FIG. 1, and FIG. 3A is a schematic cross-sectional view showing the thickness of the display apparatus 1 of FIG. 1 at a first region and a second region. FIG. 3B is an enlarged view of the corner portion 330 of FIG. 3A.

Referring to FIGS. 1 to 3, the display apparatus 1 according to the embodiment of the inventive concept may include a substrate 10, an encapsulation substrate or panel 20 facing the substrate 10, a display unit 200 disposed between the substrate 10 and the encapsulation substrate 20 and including a display area AA for displaying images, and a seal portion or a sealing portion 300 surrounding the display area AA and bonding the substrate 10 and the encapsulation substrate 20 to each other.

The substrate 10 may be a rigid glass substrate, a polymer substrate, a film having flexibility, a metal substrate, or a combination thereof. As another example, the substrate 10 may be a flexible substrate formed of a plastic material having excellent thermal resistance and excellent durability.

The encapsulation substrate 20 is disposed facing the substrate 10. For example, the encapsulation substrate 20 may be formed of a transparent member. Accordingly, an image displayed on a display surface of the display unit 200 may be exposed to the outside via the encapsulation substrate 20. In some embodiments, the encapsulation substrate 20 may further include, as a touch panel, an on-cell touch screen panel, on or over which a touch screen pattern is formed. Also, a polarization film, a color filter, or a protective window may be further disposed on or over the encapsulation substrate 20.

The display unit 200 is disposed between the substrate 10 and the encapsulation substrate 20. The display unit 200 provides an image that a user may recognize. In FIG. 2, the display unit 200 includes an array of pixels, each of which includes an organic light-emitting diode (OLED). However, one or more embodiments of the inventive concept are not limited thereto, and the display unit 200 may include a liquid crystal display (LCD) or other display devices.

The display unit 200 formed on or over the substrate 10 includes the display area AA for displaying images, and a pad portion PAD is disposed in a peripheral area which is disposed around the display area AA. The pad portion PAD is provided to transmit electric signals from a power supply apparatus or a signal generating apparatus to the display area AA. In embodiments, the display area AA has a size and a shape the substantially same with those of an image displayed by the display unit. In the embodiment illustrated in FIG. 1, the display area AA has a rectangular shape. In another embodiment illustrated in FIG. 4, the display area AA' has a circular shape. Hereinafter, a multilayered structure of the display unit 200 will be described in more detail with reference to FIG. 2.

A buffer layer 211 may be formed on the substrate 10. The buffer layer 211 may be formed on an entire surface of the substrate 10, including the display area AA and outside of the display area AA. The buffer layer 211 may planarize the substrate 10 and may prevent impurity atoms from infiltrating through the substrate 10. The buffer layer 211 may be formed of silicon oxide or silicon nitride.

A first thin film transistor TFT1 for one of the pixels and a second thin film transistor TFT2 may be formed on or over the buffer layer 211.

The first thin film transistor TFT1 includes a first active layer 212a, a first gate electrode 214a, a first source electrode 216a, and a first drain electrode 217a. A first gate insulating layer 213a is disposed between the first gate electrode 214a and the first active layer 212a to insulate the first gate electrode 214a from the first active layer 212a from each other. The first gate electrode 214a is formed on the first gate insulating layer 213a to overlap with the first active layer 212a. The first thin film transistor TFT1 may be a driving thin film transistor that is electrically connected to the OLED to drive the OLED.

The second thin film transistor TFT2 includes a second active layer 212b, a second gate electrode 214b, a second source electrode 216b, and a second drain electrode 217b. The first gate insulating layer 213a is disposed between the second gate electrode 214b and the second active layer 212b to insulate the second gate electrode 214b from the second active layer 212b. The second gate electrode 214b is formed on the first gate insulating layer 213a to overlap with the second active layer 212b.

The first active layer 212a and the second active layer 212b may be formed on the buffer layer 211. The first active layer 212a and the second active layer 212b may be formed of an inorganic semiconductor such as amorphous silicon or polysilicon, or an organic semiconductor. In some embodiments, the first active layer 212a may be formed of an oxide semiconductor. For example, the oxide semiconductor may include oxide of a material selected from group-12 metals, group-13 metals, and group-14 metals such as zinc (Zn), indium (In), gallium (Ga), tin (Sn), cadmium (Cd), or Ge, and combinations thereof.

The first gate electrode 214a and the second gate electrode 214b may be formed to have a single-layered or a multi-layered structure by using one or more selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), by taking into account attachability with adjacent layers, surface flatness of the stacked layer, and processability.

The first gate insulating layer 213a is formed on or over the buffer layer 211 to cover the first active layers 212a and the second active layer 212b. A second gate insulating layer 213b may cover the first gate electrode 214a and the second gate electrode 214b. Each of the first gate insulating layer 213b and the second gate insulating layer 213b may have a single-layered or a multi-layered structure including an inorganic layer formed of silicon oxide, silicon nitride, or metal oxide.

An interlayer insulating layer 215 is formed on or over the second gate insulating layer 213b. The interlayer insulating layer 215 may include an inorganic layer formed of silicon oxide or silicon nitride. In addition, the interlayer insulating layer 215 may include an organic layer.

The first source electrode 216a and the first drain electrode 217a are formed on the interlayer insulating layer 215. Each of the first source electrode 216a and the first drain electrode 217a contacts the first active layer 212a via a contact hole. Also, the second source electrode 216b and the second drain electrode 217b are formed on the interlayer insulating layer 215, and each of the second source electrode 216b and the second drain electrode 217b contacts the second active layer 212b via a contact hole.

The first source electrode 216a, the second source electrode 216b, the first drain electrode 217a, and the second electrode 217b may be formed to have a single-layered or a multi-layered structure by using at least one selected from Al, Pt, Pd, Ag, Mg, Au, Ni, Nd, Ir, Cr, Li, Ca, Mo, Ti, W, and Cu.

In addition, in one of the pixels, a capacitor 230 is formed to store a data signal supplied to the display unit 200 or compensate for a voltage drop of the display unit 200. For example, the capacitor 230 may include a first capacitor electrode 230a, a second capacitor electrode 230b, and the second gate insulating layer 213b disposed between the first and second capacitor electrodes 230a and 230b. The first capacitor electrode 230a may be formed of the same material as that of the second gate electrode 214b, and the second capacitor electrode 230b may be formed of the same material as that of the first gate electrode 214a.

A planarization layer 218 covers the first thin film transistor TFT1, the second thin film transistor TFT2, and the capacitor 230, and is disposed on or over the interlayer insulating layer 215. The planarization layer 218 may planarize a surface by removing steps on a layer in order to increase the light emission efficiency of the OLED that will be formed thereon. Also, the planarization layer 218 may have a through hole partially exposing the first drain electrode 217a.

The planarization layer 218 may be formed of an insulating material. For example, the planarization layer 218 may be formed to have a single-layered or a multi-layered structure including an inorganic material, an organic material, or an organic/inorganic composition material, and may be formed by various deposition methods. In some embodiments, the planarization layer 218 may be formed of at least one selected from polyacrylate resin, epoxy resin, phenolic resin, polyamide resin, polyimide resin, unsaturated polyester resin, polyphenylene ether resin, poly phenylenesulfide resin, and benzocyclobutene (BCB).

The OLED is disposed on the planarization layer 218. The OLED may include a first electrode 221, an intermediate layer 220 including an organic light emission layer, and a second electrode 222.

A pixel-defining layer 219 is formed to partially cover the planarization layer 218 and the first electrode 221 to define a pixel region. The pixel-defining layer 219 may be formed as an organic insulating layer. The organic insulating layer may include an acrylic polymer such as polymethyl methacrylate (PMMA), polystyrene (PS), polymer derivatives having a phenol group, an imide-based polymer, an aryl ether-based polymer, a fluorine-based polymer, a p-xylene-based polymer, a vinyl alcohol-based polymer, and mixtures thereof.

Holes and electrons injected from the first electrode 221 and the second electrode 222 of the OLED combine with each other in the organic emission layer of the intermediate layer 220 to emit light.

The intermediate layer 220 includes an organic light emission layer. Alternatively, the intermediate layer 220 may include the organic emission layer, and may further include at least one of a hole injection layer (HIL), a hole transport layer (HTL), an electron transport layer (ETL), and an electron injection layer (EIL). However, the present embodiment is not limited thereto, and the intermediate layer 220 may include an organic emission layer and may further include other various functional layers.

The second electrode 222 is formed on or over the intermediate layer 220. The second electrode 222 forms an electric field with the first electrode 221 to make the intermediate layer 220 emit light. The first electrode 221 may be patterned for each pixel, and a common voltage may be applied to all the pixels via the second electrode 222.

The first electrode 221 and the second electrode 222 may be formed as transparent electrodes or reflective electrodes. The first electrode 221 may function as an anode electrode, and the second electrode 222 may function as a cathode, but they are not limited thereto. For example, the first electrode 221 may function as a cathode electrode and the second electrode 222 may function as an anode electrode.

In addition, FIG. 2 shows only one OLED, but the display area AA may include a plurality of OLEDs. In addition, each of the plurality of OLEDs may form a pixel, and each pixel may emit red, green, blue, or white light.

A protective layer may be disposed on the second electrode 222, and may cover the OLED to protect the OLED. The protective layer may be formed as an inorganic insulating layer and/or an organic insulating layer. For example, the protective layer may have a structure, in which the organic insulating layers and the inorganic insulating layers are alternately stacked.

A spacer 223 is disposed between the substrate 10 and the encapsulation substrate 20 to maintain a gap between the substrate 10 and the encapsulation substrate 20, and may prevent display characteristics of the display apparatus 1 from degrading due to external shock.

In some embodiments, the spacer 223 is disposed on the pixel-defining layer 219. The spacer 223 may protrude from the pixel-defining layer 219 toward the encapsulation substrate 20. In some embodiments, the pixel-defining layer 219 and the spacer 223 may be formed integrally with each other by using a photosensitive material through a photolithography process. In embodiments, the pixel-defining layer 219 and the spacer 223 may be formed simultaneously by adjusting an exposure amount in an exposure process using a half-tone mask.

The second electrode 222 and/or the protective layer may be disposed on the spacer 223.

Circuit features or conductor layer portions 240 and 241 are formed in an area surrounded by the seal portion 300, and include a signal line 240 and a connection line 241 for electrically connecting the signal line 240 to the display unit 200.

The signal line 240 may be formed on the interlayer insulating layer 215. The signal line 240 is electrically connected to the second electrode 222 via the connection line 241 to supply signals to the second electrode 222.

The signal line 240 may be a cathode power line ELVSS. If the signal line 240 is the cathode power line ELVSS, the cathode power line ELVSS may be connected to a cathode power source having a voltage that is lower than a common power voltage, for example, a ground voltage or a negative voltage.

The sealing portion or seal 300 bonds the substrate 10 and the encapsulation substrate 20 to each other, and seals a space between the substrate 10 and the encapsulation substrate 20. Therefore, the display unit 200 disposed between the substrate 10 and the encapsulation substrate 20 may be protected against the external moisture, air, and other impurities.

The seal portion 300 may be disposed on or over the interlayer insulating layer 215, and a metal layer 100 may be disposed between the substrate 10 and the seal portion 300. For example, the metal layer 100 may be formed on or over the buffer layer 211.

The metal layer 100 includes metal having excellent thermal conductivity so as to improve a thermal transfer rate to a glass frit when the glass frit for forming the seal portion 300 is melted. For example, the metal layer 10 may include at least one selected from Au, Ag, Cu, Ni, Pt, Pd, Al, Mo, and Cr. The metal layer 100 may be formed of the same material as that of the first and second gate electrodes 214a and 214b.

Also, a plurality of openings H1 are formed in the second gate insulating layer 213b and the interlayer insulating layer 215 contacting the seal portion 300 so as to increase a contact area with the seal portion 300, and thus improve a bonding force of the seal portion 300.

The seal portion 300 may include the glass frit and a filler. The glass frit forming the seal portion 300 is melted by heat and hardened to bond the substrate 10 and the encapsulation substrate 20 to each other. The glass frit may include various materials. For example, the glass frit may include vanadium oxide or bismuth oxide. Also, the glass frit may include various materials, for example, at least one selected from a group consisting of $TeO_2$, $ZnO$, $BaO$, $Nb_2O_5$, $SIO_2$, $Al_2O_3$, $ZrO_2$, and $P_2O_5$.

When irradiating a laser beam for forming the seal portion 300, the filler makes a thermal expansion coefficient of the seal portion 300 not increase, and in particular, reduces a difference between the thermal expansion rates of the seal portion 300 and the substrate 10 and the encapsulation substrate 20 so that the seal portion 300, the substrate 10, and the encapsulation substrate 20 may be effectively bonded to each other. The filler may include at least one of Cr, Cu, and Mn. Also, the filler may contain oxides of spinel structure. For example, the filler may include at least $(CrMn)_2O_4$. The Cr component included in the filler easily realizes a black color and improves a laser beam absorbent rate of the seal portion 300 including the filler.

In addition, the seal portion 300 may be formed so that a first thickness $T_1$ at a first point may be different than a second thickness $T_2$ at a second point that is different from the first point. The first point is one of two first regions $P_1$ that are formed when a first virtual line $L_1$ passing through a central point C of the display area AA in a horizontal direction crosses the seal portion 300, and the second point is one of two second regions $P_2$ that are formed when a second virtual line $L_2$ that perpendicularly crosses the first virtual line $L_1$ at the central point C crosses the seal portion 300.

Also, the seal portion 300 may include a pair of first straight portions 310 passing through the two first regions $P_1$ in parallel with the second virtual line $L_2$, a pair of second straight portions 320 passing respectively through the two second regions $P_2$ in parallel with the first virtual line $L_1$, and corner portions 330 connecting the pair of first straight portions 310 and the pair of second straight portions 320, so as to surround the display area AA. In the embodiment illustrated in FIG. 1, the first straight portions 310 are respectively disposed adjacent long edges of the encapsulation substrate 30, and are respectively disposed adjacent long boundaries of the display area AA. Thus, the first straight portion 310 is disposed between the long boundary of the display area AA and the long edge of the encapsulation substrate 30 when viewed in a viewing direction perpendicular to a major surface of the substrate. Further, the second straight portions 320 are respectively disposed adjacent short edges of the encapsulation substrate 30, and are respectively disposed adjacent short boundaries of the display area AA. Thus, the second straight portion 320 is disposed between the short boundary of the display area AA and the short edge of the encapsulation substrate 30, when viewed in the viewing direction. The corner portions 330 are curved so as to easily form the seal portion 300.

The first thickness $T_1$ of the seal portion 300 at the first region $P_1$ may be less than the second thickness $T_2$ of the seal portion 300 at the second region $P_2$. Therefore, the encapsulation substrate 20 may be configured to have a height increasing from the first virtual line $L_1$ toward the short edges of the encapsulation substrate 20 portions along the second virtual line $L_2$. One of the second regions $P_2$ may be disposed adjacent to the pad portion PAD.

In embodiments, both of the first straight portions 310 have the first thickness $T_1$, both of the second straight portions 320 have the second thickness $T_2$, and the thickness of the seal portion 300 may continuously change from the first thickness $T_1$ to the second thickness $T_2$ at the corner portions 330 as shown in FIG. 3B. Therefore, the encapsulation substrate 20 may have a height increasing from the short boundaries of the display area AA toward the short edges of the encapsulation substrate 20 along the second virtual line $L_2$. For example, the encapsulation substrate 20 may have a shape that is concavely curved from the short boundaries of the display area AA toward the short edges of the encapsulation substrate 20. Accordingly, Newton's rings are concentrated outside the display area AA, for example, at an area between the short boundary of the display area AA and the short edge of the encapsulation substrate 20 so that Newton's rings may not be visibly recognized.

In other embodiments, the second straight portions 320 may have the second thickness $T_2$, and the pair of first straight portions 310 may have a thickness that continuously changes from the second thickness $T_2$ to the first thickness $T_1$ from the corner portions 330 toward the first point $P_1$. The height increasing rate of the pair of first straight portions 310 may gradually increase away from the corner portions 330. Therefore, in the embodiment illustrated in FIG. 1, the Newton's rings may concentrate on the upper and lower portions of the display apparatus 1, which have wider marginal spaces than those of left and right sides of the display apparatus 1, and accordingly, visible recognition of Newton's rings may be avoided, minimized or reduced.

In addition, the first thickness $T_1$ may be about 60% to about 90% of the second thickness $T_2$. If the first thickness $T_1$ is too small with reference to the second thickness $T_2$, an application amount of the glass frit for forming the seal portion 300 on the first region $P_1$ may be reduced, and thus, the bonding force of the seal portion 300 may be reduced. However, if the first thickness $T_1$ is the substantially same with or too close to the second thickness $T_2$, it may be difficult to concentrate Newton's rings outside the display area AA. Therefore, in embodiments, the first thickness $T_1$ may be formed within a range of 60% to 90% of the second thickness $T_2$ although the invention is not limited thereto.

Figure 4:
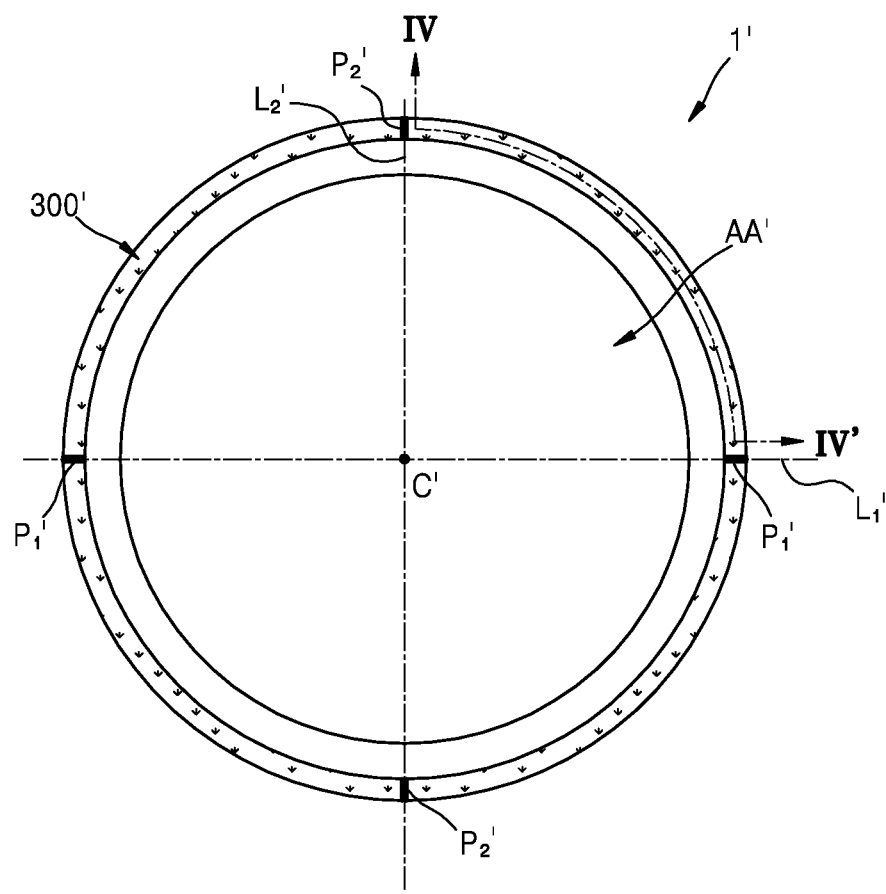
FIG. 4 is a schematic plan view of a display apparatus according to another embodiment.
Figure 5:
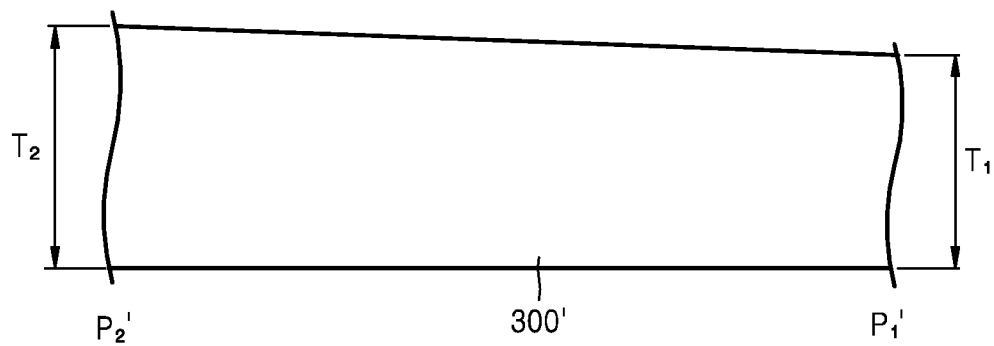
FIG. 5 is a schematic cross-sectional view of the display apparatus taken along a line IV-IV' of FIG. 4.

FIG. 4 is a schematic plan view of a display apparatus 1' according to another embodiment, which is different from the display apparatus 1 of FIG. 1, and FIG. 5 is a schematic cross-sectional view of the display apparatus 1', which is taken along a line IV-IV' of FIG. 4.

FIG. 4 shows that the display apparatus 1' includes a circular display area AA' and a seal portion 300' that forms a single closed loop while surrounding the display area AA'. However, one or more embodiments of the inventive concept are not limited thereto, and the display area AA' may have various shapes such as an oval shape and a polygonal shape.

The seal portion 300' may be formed to have a first thickness $T_1$ at a first point and a second thickness $T_2$ at a second point that is different from the first point. The first point is one of two first regions $P_1'$ that are formed when a first virtual line $L_1'$ passing through a central point C' of the display area AA' in a horizontal direction crosses the seal portion 300', and the second point is one of two second regions $P_2'$ that are formed when a second virtual line $L_2'$ that perpendicularly crosses the first virtual line $L_1'$ at the central point C' crosses the seal portion 300.

The second thickness $T_2$ may be greater than the first thickness $T_1$. For example, the seal portion 300' may have a thickness that continuously changes from the first thickness $T_1$ to the second thickness $T_2$ from the first point toward the second point, that is, from the first region $P_1'$ toward the second region $P_2'$. Also, the thickness increasing rate of the seal portion 300' may be increased toward the second region $P_2'$. Therefore, in the embodiment illustrated in FIG. 4, the display apparatus 1' has a height that increases from the first virtual line $L_1'$ toward the upper and lower portions along with the second virtual line $L_2'$, and thus, may have a concave shape. Accordingly, Newton's rings may concentrate on the upper and lower portions of the apparatus 1' outside the display area AA', and thus, visual recognition of Newton's rings may be avoided, minimized or reduced.

In addition, the first thickness $T_1$ may range from about 60% to about 90% of the second thickness $T_2$ by taking into account the concentration of Newton's rings on the upper and lower portions of the apparatus 1' outside the display area AA' and the bonding force.

Figure 6:
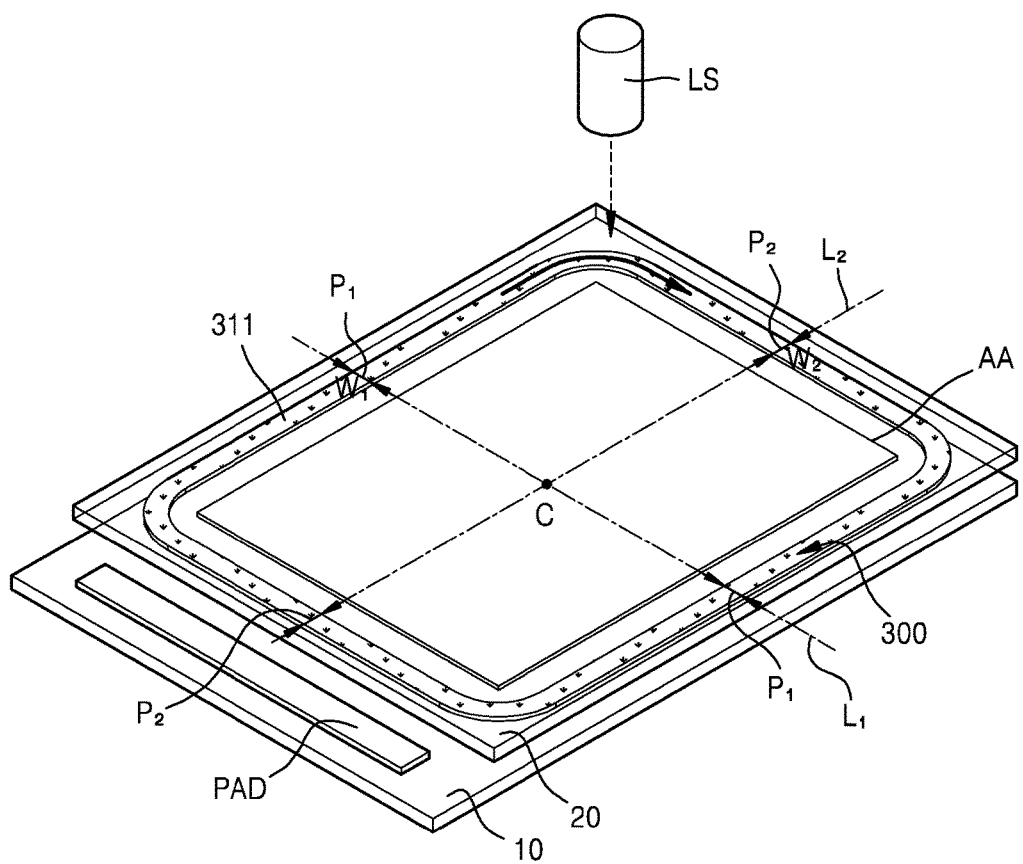
FIG. 6 is a schematic perspective view illustrating a method of manufacturing the display apparatus of FIG. 1.

FIG. 6 is a perspective view of a method of manufacturing the display apparatus 1 of FIG. 1.

Hereinafter, the method of manufacturing the display apparatus 1 will be described below with reference to FIG. 6 and FIGS. 1 and 3.

The method of manufacturing the display apparatus 1 may include preparing the substrate 10 and the encapsulation substrate 20, forming the display unit 200 over the substrate 10 to include the display area AA for displaying images, placing the encapsulation substrate 20 such that the display unit 200 is disposed between the substrate 10 and the encapsulation substrate 20, and bonding the substrate 10 and the encapsulation substrate 20 to each other by using the seal portion 300.

The display unit 200 is formed on or over the substrate 10. The display unit 200 may include the array of OLEDs, each including the first electrode 221, the intermediate layer 220 including an organic emission layer, and the second electrode 222.

After forming the display unit 200 over the substrate 10 as shown in FIG. 2, a sealing material in a paste state is applied on a surface of the substrate 10 or the encapsulation substrate 20, thereby forming a preliminary or uncured sealing portion 311. And then, the uncured sealing portion 311 is baked and dried.

The preliminary sealing portion 311 is a paste including the glass frit and the filler, and may be deposited on the substrate 10 or the encapsulation substrate 20 in a desired shape by using a screen printing method.

The preliminary sealing portion 311 may be applied so that a width $W_1$ at the first point is different than a second width $W_2$ at the second point. The first point is one of two first regions $P_1$ that are formed when a first virtual line $L_1$ passing through a central point C of the display area AA in a horizontal direction crosses the seal portion 300, and the second point is one of two second regions $P_2$ that are formed when a second virtual line $L_2$ that perpendicularly crosses the first virtual line $L_1$ at the central point C crosses the seal portion 300.

For example, the first width $W_1$ may be less than the second width $W_2$. Accordingly, even if the preliminary sealing portion 311 is formed to a constant thickness, the seal portion 300 may have a relatively lower height at the first regions $P_1$ where the preliminary sealing portion 311 is applied with relatively smaller widths through the melting and hardening processes of the preliminary sealing portion 311.

After forming the preliminary sealing portion 311, the substrate 10 and the encapsulation substrate 20 are aligned with each other, and a laser beam is irradiated from above the encapsulation substrate 20 by using a laser light source LS. The laser beam may have a wavelength of about 700 nm to about 900 nm. In particular, the laser beam is irradiated along with the preliminary sealing portion 311. When the laser beam is irradiated, the preliminary sealing portion 311 is melted and cured so that the substrate 10 and the encapsulation substrate 20 are bonded to each other. Here, the metal layer 100 including the metal having excellent thermal conductivity may improve the thermal transfer to the glass frit.

In addition, since the width at the first regions $P_1$ of the preliminary sealing portion 311 is less than that of the second regions $P_2$, energy per unit area transferred to the preliminary sealing portion 311 applied on the first regions $P_1$ is greater than the energy per unit area transferred to the preliminary sealing portion 311 applied to the second regions $P_2$. Therefore, when the preliminary sealing portion 311 is melted, the preliminary sealing portion 311 on the first regions $P_1$ is spread wider than the preliminary sealing portion 311 on the second regions $P_2$, and accordingly, the first thickness $T_1$ at the first regions $P_1$ may be less than the second thickness $T_2$ at the second regions $P_2$. The first thickness $T_1$ may be formed at about 60% to about 90% of the second thickness $T_2$.

In particular, after applying the preliminary sealing portion 311 having a width of 490 μm on the first regions $P_1$ and a width of 650 μm on the second regions $P_2$, a laser beam having a wavelength of 810 nm was irradiated to the preliminary sealing portion 311 to cure the preliminary sealing portion 311. Then, the height of the first regions $P_1$ of the seal portion 300 was 4.44 μm and the height of the second regions $P_2$ of the seal portion 300 was 4.76 μm.

As described above, since the first thickness $T_1$ on the first regions $P_1$ is less than the second thickness $T_2$ on the second regions $P_2$, the encapsulation substrate 20 may have a height that increases from the first virtual line $L_1$ toward the upper and lower portions along with the second virtual line $L_2$. Accordingly, Newton's rings concentrates on the upper and lower portions outside the display area AA, and the visual recognition of Newton's rings may be minimized or reduced.

In addition, the pad portion PAD may be disposed adjacent to the upper or lower side of the display apparatus 1, which have wider marginal spaces than those of the left and right sides of the display apparatus 1, that is, the second regions $P_2$.

As described above, according to the one or more of the above embodiments, the visual recognition of Newton's rings may be minimized or prevented.

It should be understood that the embodiments described therein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
    a substrate comprising a major surface;
    an encapsulation panel opposing the substrate;
    a display unit disposed between the substrate and the encapsulation panel and comprising a display area for displaying images; and
    a seal portion disposed between the substrate and the encapsulation panel and surrounding the display area when viewed in a direction perpendicular to the major surface, the seal portion bonding the substrate and the encapsulation panel,
    wherein the seal portion comprises a first surface facing the substrate and a second surface facing the encapsulation panel,
    wherein the seal portion has a first thickness that is a distance between the first surface and the second surface measured at a first point and a second thickness that is a distance between the first surface and the second surface measured at a second point,
    wherein, when viewed in the direction, a first virtual line passing a center point of the display area and the first point is substantially perpendicular to a second virtual line passing the center point and the second point,
    wherein the first thickness is substantially different from the second thickness,
    wherein the seal portion comprises a pair of first straight portions being parallel to the second virtual line, a pair of second straight portions being parallel to the first virtual line, and corner portions connecting the pair of first straight portions and the pair of second straight portions, and wherein each of the pair of first straight portions has the first thickness, each of the pair of second straight portions has the second thickness, and each of the corner portions has a thickness gradually changing from the first thickness to the second thickness.

2. The display apparatus of claim 1, wherein the first thickness is about 60% to about 90% of the second thickness.

3. The display apparatus of claim 2, wherein the display unit comprises a pad portion electrically connected to the display area for applying electric signals to the display area, and the pad portion is disposed adjacent to the second point and is not surrounded by the seal portion when viewed in the direction.

4. The display apparatus of claim 2, wherein the seal portion forms a closed loop.

5. The display apparatus of claim 2, wherein the display unit comprises an array of pixels, each of which comprises an organic light-emitting diode (OLED), wherein the OLED comprises a first electrode, a second electrode, and an intermediate layer disposed between the first electrode and the second electrode and comprising an organic light emission layer.

6. The display apparatus of claim 5, further comprising a thin film transistor (TFT) that is electrically connected to the first electrode and comprises an active layer, a gate electrode, a source electrode, and a drain electrode.

7. The display apparatus of claim 1, wherein the corner portion has a curved shape.

* * * * *